United States Patent
Shin et al.

(12)

(10) Patent No.: US 11,323,138 B1
(45) Date of Patent: May 3, 2022

(54) REED-SOLOMON CODE SOFT-DECISION DECODING METHOD AND DEVICE

(71) Applicants: SK hynix Inc., Icheon (KR); Korea University Research and Business Foundation, Seoul (KR)

(72) Inventors: Won Gyu Shin, Seoul (KR); Jong Sun Park, Seoul (KR); Dong Yeob Shin, Seoul (KR); Jin Ho Jeong, Seoul (KR)

(73) Assignees: SK hynix Inc., Icheon (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/206,632

(22) Filed: Mar. 19, 2021

(30) Foreign Application Priority Data

Oct. 29, 2020 (KR) .......................... 10-2020-0141950

(51) Int. Cl.
*H03M 13/45* (2006.01)
*H03M 13/15* (2006.01)
*H03M 13/37* (2006.01)

(52) U.S. Cl.
CPC ....... *H03M 13/45* (2013.01); *H03M 13/1515* (2013.01); *H03M 13/1545* (2013.01); *H03M 13/1575* (2013.01); *H03M 13/373* (2013.01)

(58) Field of Classification Search
CPC ............. H03M 13/45; H03M 13/1515; H03M 13/1545; H03M 13/1575; H03M 13/373
See application file for complete search history.

(56) References Cited

U.S. PATENT DOCUMENTS

| 2005/0172208 A1* | 8/2005 | Yoon | H03M 13/154 714/784 |
| 2012/0020276 A1* | 1/2012 | Markman | H04L 1/004 370/312 |
| 2012/0072809 A1* | 3/2012 | Kong | G06F 11/1008 714/782 |
| 2019/0129791 A1* | 5/2019 | Kreifels | G06F 11/1048 |

FOREIGN PATENT DOCUMENTS

| KR | 20140088423 A | 7/2014 |
| KR | 101624145 B1 | 5/2016 |

* cited by examiner

*Primary Examiner* — Thien Nguyen

(57) ABSTRACT

Disclosed is an erasure-based Reed-Solomon code soft-decision decoding method and device, capable of reducing a decoding time while minimizing the effect on error correction performance. The Reed-Solomon code soft-decision decoding device includes an erasure control circuit configured to determine whether a number of errors in a codeword is odd or even, and to provide a key equation solver circuit with a first erasure pattern or a second erasure pattern according to a result of the determining when a decoding failure is detected by a decoding error detection circuit, the first erasure pattern being provided when the number of errors is odd, the second erasure pattern being provided when the number of errors is even.

19 Claims, 4 Drawing Sheets

REED-SOLOMON CODE SOFT-DECISION DECODING METHOD AND DEVICE

CROSS-REFERENCE TO RELATED APPLICATION

This application claims priority under 35 U.S.C. § 119 to Korean Patent Application No. 10-2020-0141950 filed on Oct. 29, 2020, which is incorporated herein by reference in its entirety.

BACKGROUND

1. Field

Exemplary embodiments relate to a Reed-Solomon code soft-decision decoding method and device, and more particularly, to an erasure-based Reed-Solomon code soft-decision decoding method and device, capable of reducing a decoding time.

2. Discussion of the Related Art

Reed-Solomon code soft-decision decoding includes successive error-and-erasure decoding (SED). The SED iterates decoding while changing erasure patterns according to an order decided by an algorithm. Such a decoding method may expect the improvement in error correction performance as the number of iterations increases, but has a disadvantage in that a decoding time is greatly increased.

Particularly, the decoding time of the SED may be limited depending on applications. For example, a phase change memory (PCM) requires a short decoding time. However, when the number of iterations of decoding is reduced in order to reduce the decoding time of the SED, the error correction performance may be degraded.

Accordingly, there is a need for a technology capable of reducing the decoding time while minimizing the degradation of the error correction performance of the SED.

SUMMARY

Various embodiments are directed to providing an erasure-based Reed-Solomon code soft-decision decoding method and device, capable of reducing a decoding time while minimizing the degradation of error correction performance.

In an embodiment, a Reed-Solomon code soft-decision decoding device may include: a syndrome generation circuit configured to generate a syndrome from a codeword; a key equation solver circuit configured to generate an error location polynomial and an error evaluation polynomial based on the syndrome; a Chien-search & error-evaluator circuit configured to determine a location and magnitude of an error in the codeword based on the error location polynomial and the error evaluation polynomial; a decoding error detection circuit configured to determine whether decoding on the codeword is successful or failed based on the location and magnitude of the error; and an erasure control circuit configured to determine whether a number of errors in the codeword is odd or even, and to provide the key equation solver circuit with a first erasure pattern or a second erasure pattern according to a result of the determining when a decoding failure is detected by the decoding error detection circuit, the first erasure pattern being provided when the number of errors is odd, the second erasure pattern being provided when the number of errors is even.

In an embodiment, a Reed-Solomon code soft-decision decoding method may include steps of: generating a syndrome from a codeword; generating an error location polynomial and an error evaluation polynomial based on the syndrome; determining a location and magnitude of an error in the codeword based on the error location polynomial and the error evaluation polynomial; determining whether decoding on the codeword is successful or failed based on the location and magnitude of the error; and determining whether a number of errors in the codeword is odd or even, and performing decoding on the codeword based on the syndrome and a first erasure pattern or based on the syndrome and a second erasure pattern according to a result of the determining when a decoding failure is detected, the first erasure pattern being provided when the number of errors is odd, the second erasure pattern being provided when the number of errors is even.

In an embodiment, a semiconductor device may include: a memory cell array configured to store a codeword; and a Reed-Solomon code soft-decision decoding device configured to read the codeword from the memory cell array, decode the codeword, and output error-corrected data corresponding to the codeword, wherein the Reed-Solomon code soft-decision decoding device comprises: a syndrome generation circuit configured to generate a syndrome from the codeword; a key equation solver circuit configured to generate an error location polynomial and an error evaluation polynomial based on the syndrome; a Chien-search & error-evaluator circuit configured to determine a location and magnitude of an error in the codeword based on the error location polynomial and the error evaluation polynomial; a decoding error detection circuit configured to determine whether decoding on the codeword is successful or failed based on the location and magnitude of the error; and an erasure control circuit configured to determine whether a number of errors in the codeword is odd or even, and to provide the key equation solver circuit with a first erasure pattern or a second erasure pattern according to a result of the determining when a decoding failure is detected by the decoding error detection circuit, the first erasure pattern being provided when the number of errors is odd, the second erasure pattern being provided when the number of errors is even.

In accordance with embodiments, it is possible to correct an error by using only an erasure pattern corresponding to one of an even number of errors and an odd number of errors. Accordingly, it is possible to reduce a decoding time while minimizing the degradation of error correction performance.

DETAILED DESCRIPTION

Figure 1:
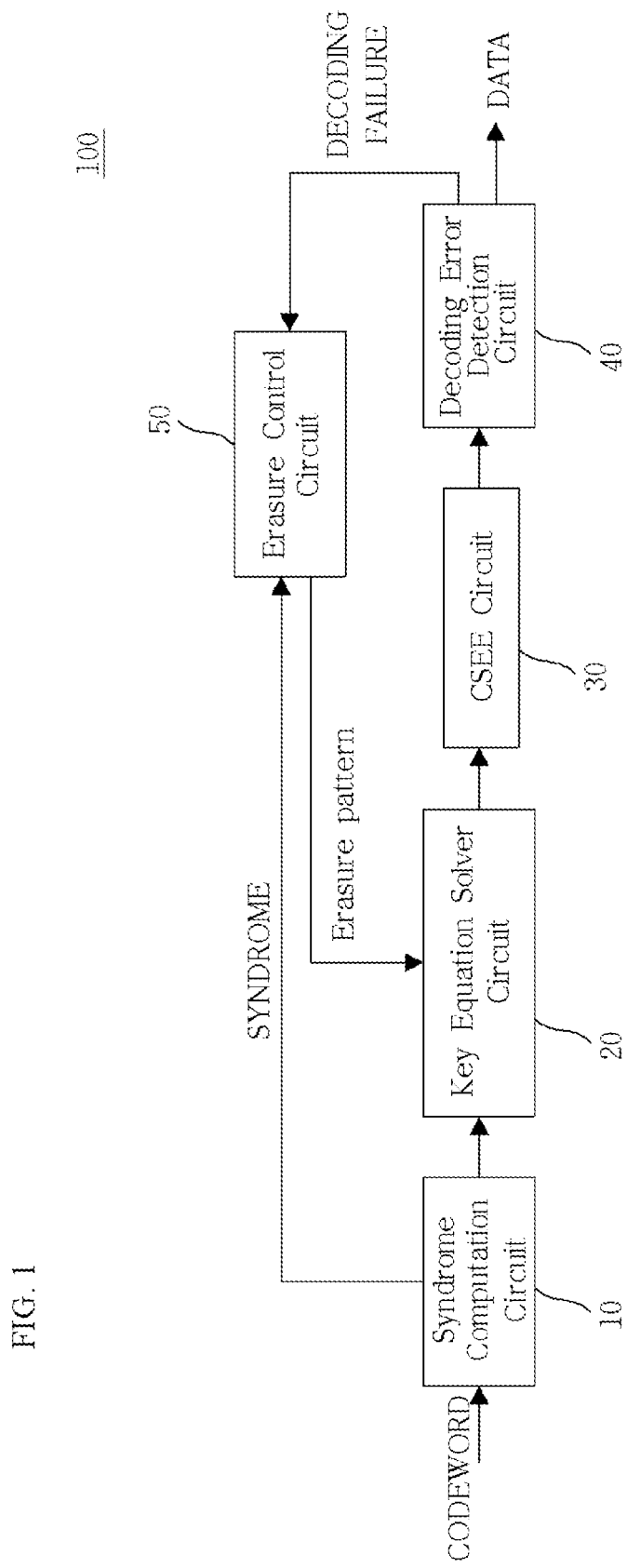
FIG. 1 is a block diagram illustrating a Reed-Solomon code soft-decision decoding device in accordance with an embodiment.

Various embodiments will be described below in detail with reference to the accompanying drawings such that the present disclosure can be easily carried out by those skilled in the art to which the present disclosure pertains. The same reference numerals among the reference numerals illustrated in each drawing denote the same members.

In the description of the present disclosure, when it is determined that detailed descriptions of related publicly-known technologies may obscure the subject matter of the present disclosure, detailed descriptions thereof will be omitted.

The terms such as 'first' and 'second' may be used to distinguish one component from another component. However, the components are not limited by the terms such as the 'first' and 'second.'

Embodiments of the present disclosure provide an erasure-based Reed-Solomon code soft-decision decoding method and device, capable of reducing a decoding time while minimizing the degradation of error correction performance.

In accordance with embodiments, in a Reed-Solomon code, a codeword may include a plurality of symbols and one symbol may include 8-bit data. The data may include real data and parity data.

In accordance with embodiments, 'error correction' may be defined as correcting an error whose error location may be unknown in the codeword, and 'erasure correction' may be defined as correcting an error whose error location may be known in the codeword.

In accordance with embodiments, in the relation between error correction performance and erasure correction performance, one error correction performance may correspond to two erasure correction performances.

In accordance with embodiments, a syndrome may be generated based on the symbols of the codeword, and may indicate a form of damage to the codeword due to an error. Each of the syndrome and the symbols may include a plurality of bits. The plurality bits of the syndrome may be obtained by logically calculating values of the bits between the symbols. Such the syndrome can be used to determine the number of symbol errors in the codeword as odd or even. Such the syndrome may be used for generating an error location polynomial and an error evaluation polynomial capable of computing the location and magnitude of the error.

In accordance with embodiments, the plurality of bits of the syndrome may be used for determining whether the number of errors in symbols is odd or even. For example, an error correction decoder of the Reed-Solomon code may determine the number of errors in the symbols to be odd when the number of bits each having a value of '1' in the syndrome is odd, and may determine the number of errors in the symbols to be even when the number of bits each having the value of '1' in the syndrome is even.

In accordance with embodiments, an odd error number may be defined as the number of errors in symbols in the codeword that is odd, and an even error number may be defined as the number of errors in symbols in the codeword that is even.

In accordance with embodiments, an erasure pattern may be defined as a pattern for erasing the symbols of the codeword in order to correct an error of the codeword in the Reed-Solomon code. In accordance with embodiments, symbols with low reliability among the symbols of the codeword may be preferentially erased using the erasure pattern.

FIG. 1 is a block diagram illustrating a Reed-Solomon code soft-decision decoding device 100 in accordance with an embodiment.

Referring to FIG. 1, the Reed-Solomon code soft-decision decoding device 100 may include a syndrome generation circuit 10, a key equation solver circuit 20, a Chien-search & error-evaluator (CSEE) circuit 30, a decoding error detection circuit 40, and an erasure control circuit 50.

The syndrome generation circuit 10 may receive a codeword including a plurality of symbols and generate a syndrome from the codeword.

The syndrome generation circuit 10 may generate the syndrome by computing bits of each symbol of the codeword by using a preset algorithm. Since the preset algorithm for generating the syndrome is well known, descriptions of generating the syndrome is omitted herein.

The key equation solver circuit 20 may generate an error location polynomial and an error evaluation polynomial from the syndrome.

The CSEE circuit 30 may compute a location and magnitude of an error in the codeword based on the error location polynomial and the error evaluation polynomial.

The decoding error detection circuit 40 may determine whether decoding is successful or failed based on the location and magnitude of the error.

The erasure control circuit 50 may determine whether the number of errors in the codeword is odd or even, and may provide the key equation solver circuit 20 with a first erasure pattern corresponding to an odd error number or a second erasure pattern corresponding to an even error number according to a result of the determining when a decoding failure is detected by the decoding error detection circuit 40.

The erasure control circuit 50 may receive the syndrome from the syndrome generation circuit 10 and determine the number of errors in the codeword to be odd or even by using the characteristics of the syndrome. For example, in order to determine the number of errors in the symbols of the codeword, the erasure control circuit 50 may determine the number of symbol errors in the codeword to be odd or even depending on the number of bits having a value of '1' in the syndrome.

For example, when the number of bits each having a value of '1' in the syndrome is odd, the erasure control circuit 50 may determine the number of symbol errors to be odd, and when the number of bits each having the value of '1' in the syndrome is even, the erasure control circuit 50 may determine the number of symbol errors to be even. When the number of symbol errors is determined to be even, the number of errors in the symbols of the codeword is determined to be even. When the number of symbol errors is determined to be odd, the number of errors in the symbols of the codeword is determined to be odd.

Then, when the number of symbol errors is determined to be odd and the decoding failure is detected by the decoding error detection circuit 40, the erasure control circuit 50 may provide, as the first erase pattern, 2+4j erasure patterns to the key equation solver circuit 20, j being an integer equal to or more than 0. For example, the erase control circuit 50 may provide two erase patterns to the key equation solver circuit 20 when the number of symbol errors is determined as odd and the decoding failure is detected. In addition, the erase control circuit 50 may provide six erase patterns to the key equation solver circuit 20 when the decoding failure is detected even after erasure correction. Here, the 2+4j erasure patterns may be provided in an order in which a symbol with low reliability among the symbols of the codeword is preferentially erased.

The erasure control circuit 50 may provide the 2+4j erasure patterns in an order in which a symbol with low reliability among the symbols of the codeword is preferentially erased. This will be described in detail in the description associated with FIG. 3.

On the other hand, when the number of symbol errors is determined to be even and the decoding failure is detected by the decoding error detection circuit 40, the erasure control circuit 50 may provide, as the second erasure pattern, 4k erasure patterns to the key equation solver circuit 20, k being a positive integer. For example, the erase control circuit 50 may provide four erase patterns to the key equation solver circuit 20 when the number of symbol errors is determined as even and the decoding failure is detected. Here, the 4k erasure patterns may be provided in an order in which a symbol with low reliability among the symbols of the codeword is preferentially erased.

The erasure control circuit 50 may provide the 4k erasure patterns in an order in which a symbol with low reliability among the symbols of the codeword is preferentially erased. This will be described in detail in the description associated with FIG. 4.

When the number of errors in the symbols in the codeword is odd, the key equation solver circuit 20 may receive the 2+4j erasure patterns from the erasure control circuit 50 and compute the error location polynomial and the error evaluation polynomial based on the syndrome and the 2+4j erasure patterns.

On the other hand, when the number of errors in the symbols in the codeword is even, the key equation solver circuit 20 may receive the 4k erasure patterns from the erasure control circuit 50 and compute the error location polynomial and the error evaluation polynomial based on the syndrome and the 4k erasure patterns.

Figure 2:
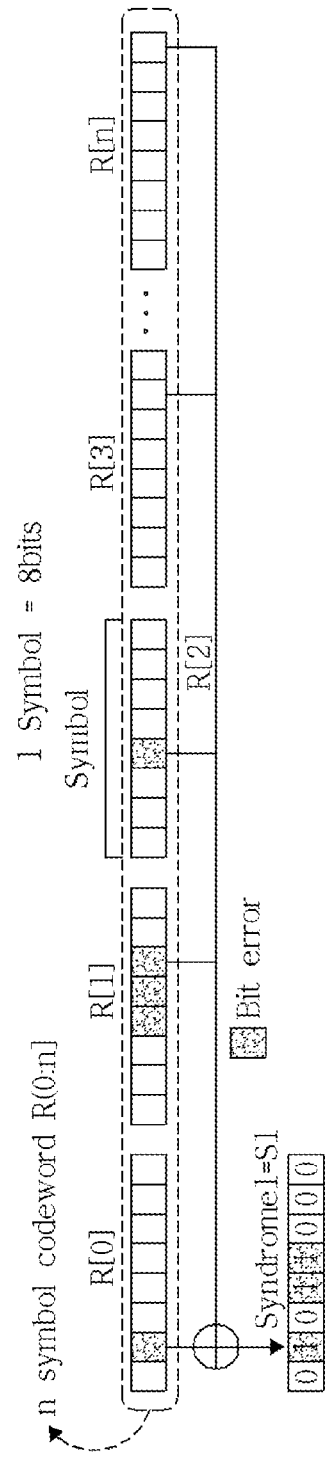
FIG. 2 illustrates a method of determining whether the number of errors is odd or even by using a syndrome.

FIG. 2 illustrates a method of determining whether the number of errors is odd or even by using the syndrome.

Referring to FIG. 2, a codeword R[0:n] may include a plurality of symbols R[0] to R[n], and one symbol may include 8-bit data, n being a positive integer.

A syndrome1 S1 may be generated based on each symbol of the codeword R[0:n]. Such a syndrome may indicate a form of damage to the codeword R[0:n] due to an error, and may be used for generating an error location polynomial and an error evaluation polynomial capable of computing a location and magnitude of the error.

Furthermore, the syndrome1 S1 may be used for determining whether the number of errors in the symbols of the codeword R[0:n] is odd or even. For example, when the number of bits each having a value of '1' in the syndrome1 S1 is odd, the number of errors in the symbols of the codeword R[0:n] may be determined to be odd, and when the number of bits each having the value of '1' in the syndrome1 S1 is even, the number of errors in the symbols of the codeword R[0:n] may be determined to be even.

As illustrated in FIG. 2, when a bit error has occurred in the first symbol R[0], the second symbol R[1], and the third symbol R[2], since the number of bits each having the value of '1' in the syndrome1 S1 is 3. Thus, the number of symbol errors may be determined to be odd.

In this way, in an embodiment, whether the number of errors in the symbols of the codeword R[0:n] is odd or even may be determined using the bit values of the syndrome1 S1.

Figure 3:
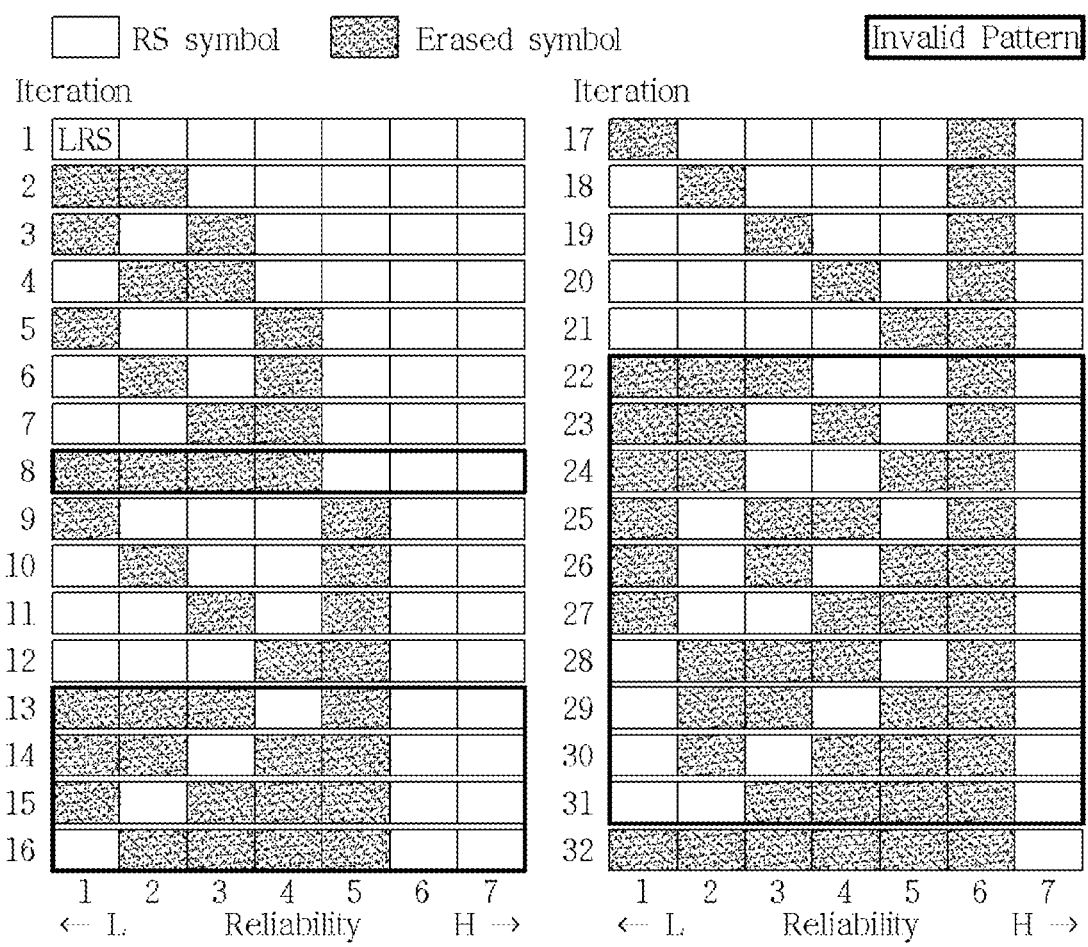
FIG. 3 illustrates a first erasure pattern corresponding to a case where the number of errors is odd.

FIG. 3 illustrates a first erasure pattern corresponding to a case where the number of errors is odd.

Referring to FIG. 3, the reliability of symbols in a codeword may be computed during decoding, and symbols with the lowest reliability among the symbols in the codeword may be arranged to be preferentially subjected to the erasure correction using an erasure pattern.

In an embodiment, when the number of errors in the symbols of the codeword is determined to be odd, the erasure correction may be performed using 2+4j erasure patterns, j being an integer equal to or more than 0.

Specifically, in an embodiment, the symbols with low reliability may be decoded based on a syndrome.

Subsequently, when a decoding failure is detected and the number of errors is determined to be odd, the erasure correction may be performed by applying the 2+4j erasure patterns to the codeword.

For example, when the number of errors is determined to be odd, a first symbol and a second symbol with low reliability among the symbols in the codeword may be subjected to the erasure correction using two erasure patterns among the 2+4j erasure patterns, and then whether the decoding is successful or failed may be determined based on a location and magnitude of an error computed after the erasure correction is performed on the first symbol and the second symbol.

Subsequently, when the decoding is failed, the first symbol and a third symbol may be subjected to the erasure correction using two erasure patterns among the 2+4j erasure patterns, and then whether the decoding is successful or failed may be determined based on a location and magnitude of an error computed after the erasure correction is performed on the first symbol and the third symbol.

Subsequently, when a decoding failure is detected, the second symbol and the third symbol may be subjected to the erasure correction using two erasure patterns among the 2+4j erasure patterns, and then whether the decoding is successful or failed may be determined based on a location and magnitude of an error computed after the erasure correction is performed on the second symbol and the third symbol.

In this way, symbols with the lowest reliability among the symbols in the codeword may be preferentially subjected to the erasure correction using the 2+4j erasure patterns, and the erasure correction process may be iterated until a decoding success is detected.

As described above, in an embodiment, when the number of errors occurring in the symbols of the codeword is odd, an error may be corrected using the 2+4j erasure patterns, and thus the iterative process of performing the erasure correction by applying 4k erasure patterns corresponding to an even error number can be skipped, so that it is possible to reduce a total decoding time by half.

Figure 4:
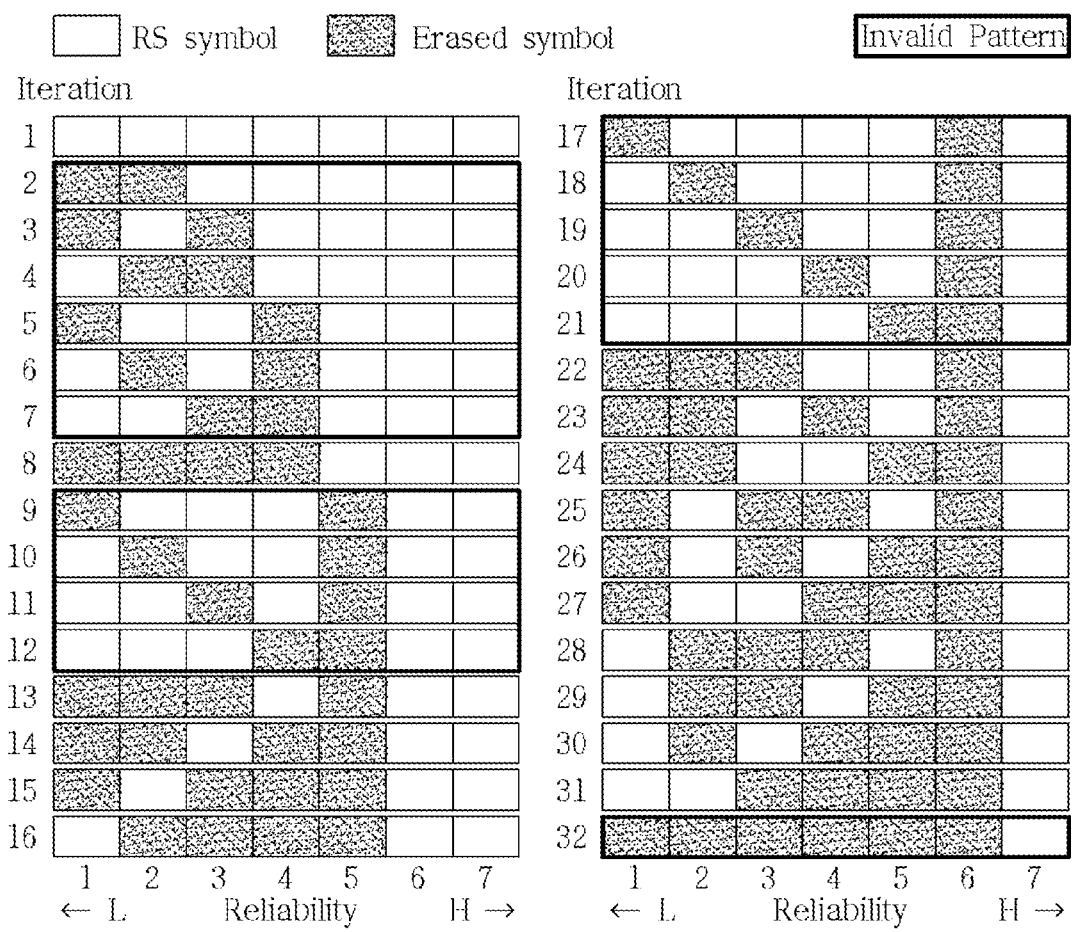
FIG. 4 illustrates a second erasure pattern corresponding to a case where the number of errors is even.

FIG. 4 illustrates a second erasure pattern corresponding to a case where the number of errors is even.

Referring to FIG. 4, the reliability of symbols in a codeword may be computed during decoding, and symbols with the lowest reliability among the symbols in the codeword may be arranged to be preferentially subjected to the erasure correction using an erasure pattern.

In an embodiment, when the number of errors in the symbols of the codeword is determined to be even, the erasure correction may be performed using 4k erasure patterns, k being a positive integer.

Specifically, symbols with low reliability among the symbols in the codeword may be decoded based on a syndrome.

Subsequently, when a decoding failure is detected and the number of errors is determined to be even, the erasure correction may be performed by applying the 4k erasure patterns to the codeword.

For example, when the number of errors is determined to be even, first to fourth symbols with low reliability among the symbols in the codeword may be subjected to the erasure correction using four erasure patterns among the 4k erasure patterns, and then whether the decoding is successful or failed may be determined based on a location and magnitude of an error computed after the erasure correction is performed on the first to fourth symbols.

Subsequently, when the decoding is failed, the first symbol, the second symbol, the third symbol, and a fifth symbol may be subjected to the erasure correction using four erasure patterns among the 4k erasure patterns, and then whether the decoding is successful or failed may be determined based on a location and magnitude of an error computed after the erasure correction is performed on the first symbol, the second symbol, the third symbol, and the fifth symbol.

Subsequently, when a decoding failure is detected, the first symbol, the second symbol, the third symbol, and the fifth symbol may be subjected to the erasure correction using four erasure patterns among the 4k erasure patterns, and then whether decoding is successful or failed may be determined based on a location and magnitude of an error computed after the erasure correction is performed on the first symbol, the second symbol, the third symbol, and the fifth symbol.

In this way, symbols with the lowest reliability among the symbols in the codeword may be preferentially subjected to the erasure correction using the 4k erasure patterns, and the erasure correction process may be iterated until a decoding success is detected.

As described above, when the number of errors occurring in the symbols of the codeword is even, an error may be corrected using the 4k erasure patterns, and thus the iterative process of performing erasure correction by applying the 2+4j erasure patterns corresponding to an odd error number can be skipped. Accordingly, it is possible to reduce the total decoding time by half.

Meanwhile, the embodiment may be applied to a semiconductor device including a memory cell array.

The semiconductor device may include the memory cell array (not illustrated) and the Reed-Solomon code soft-decision decoding device 100 shown in FIG. 1.

The memory cell array may store a codeword encoded with the Reed-Solomon code.

The Reed-Solomon code soft-decision decoding device 100 may read the codeword from the memory cell array, and correct an error of the codeword using a corresponding erasure pattern.

Furthermore, the embodiment may be also applied to a communication device that decodes data of a communication channel that is encoded with the Reed-Solomon code.

As described above, in accordance with the embodiments, it is possible to correct an error of a codeword or data by using only an erasure pattern corresponding to an even error number or an erasure pattern corresponding to an odd error number, so that it is possible to reduce a total decoding time while minimizing the degradation of the error correction performance.

Although various embodiments have been illustrated and described, various changes and modifications may be made to the described embodiments without departing from the spirit and scope of the invention as defined by the following claims.

What is claimed is:

1. A Reed-Solomon code soft-decision decoding device, comprising:
a syndrome generation circuit configured to generate a syndrome from a codeword;
a key equation solver circuit configured to generate an error location polynomial and an error evaluation polynomial based on the syndrome;
a Chien-search & error-evaluator circuit configured to determine a location and magnitude of an error in the codeword based on the error location polynomial and the error evaluation polynomial;
a decoding error detection circuit configured to determine whether decoding on the codeword is successful or failed based on the location and magnitude of the error; and
an erasure control circuit configured to determine whether a number of errors in the codeword is odd or even, and to provide the key equation solver circuit with a first erasure pattern or a second erasure pattern according to a result of the determining when a decoding failure is detected by the decoding error detection circuit, the first erasure pattern being provided when the number of errors is odd, the second erasure pattern being provided when the number of errors is even.

2. The Reed-Solomon code soft-decision decoding device of claim 1, wherein the erasure control circuit receives the syndrome from the syndrome generation circuit and determines whether the number of errors in the codeword is odd or even by using characteristics of the syndrome.

3. The Reed-Solomon code soft-decision decoding device of claim 2, wherein, when a number of bits each having a value of 1 in the syndrome is odd, the erasure control circuit determines the number of errors to be odd, and when the number of bits each having the value of 1 in the syndrome is even, the erasure control circuit determines the number of errors to be even.

4. The Reed-Solomon code soft-decision decoding device of claim 1, wherein, when the number of errors is determined to be odd and the decoding failure is detected, the erasure control circuit provides, as the first erasure pattern, 2+4j erasure patterns to the key equation solver circuit, j being an integer equal to or more than 0.

5. The Reed-Solomon code soft-decision decoding device of claim 4, wherein, when the number of errors is determined to be even and the decoding failure is detected, the erasure control circuit provides, as the second erasure pattern, 4k erasure patterns to the key equation solver circuit, k being a positive integer.

6. The Reed-Solomon code soft-decision decoding device of claim 5, wherein the erasure control circuit provides the key equation solver circuit with the 2+4j erasure patterns or the 4k erasure patterns in an order in which a symbol with low reliability among symbols in the codeword is preferentially erased.

7. The Reed-Solomon code soft-decision decoding device of claim 1, wherein the key equation solver circuit calculates the error location polynomial and the error evaluation polynomial based on the syndrome and 2+4j erasure patterns that are the first erasure pattern or based on the syndrome and 4k erasure patterns that are the second erasure pattern.

8. A Reed-Solomon code soft-decision decoding method, comprising:
generating a syndrome from a codeword;
generating an error location polynomial and an error evaluation polynomial based on the syndrome;
determining a location and magnitude of an error in the codeword based on the error location polynomial and the error evaluation polynomial;
determining whether decoding on the codeword is successful or failed based on the location and magnitude of the error; and
determining whether a number of errors in the codeword is odd or even, and performing decoding on the codeword based on the syndrome and a first erasure pattern or based on the syndrome and a second erasure pattern according to a result of the determining when a decoding failure is detected, the first erasure pattern being provided when the number of errors is odd, the second erasure pattern being provided when the number of errors is even.

9. The Reed-Solomon code soft-decision decoding method of claim 8, wherein, in determining whether the number of errors in the codeword is odd or even, a number of symbol errors in the syndrome is determined to be odd or even by using characteristics of the syndrome.

10. The Reed-Solomon code soft-decision decoding method of claim 9, wherein, in determining whether the number of errors in the codeword is odd or even, when a number of bits each having a value of 1 in the syndrome is odd, the number of symbol errors is determined to be odd, and when the number of bits each having the value of 1 in the syndrome is even, the number of symbol errors is determined to be even.

11. The Reed-Solomon code soft-decision decoding method of claim 8, wherein performing the decoding based on the syndrome and the first erasure pattern comprises:
applying, as the first erasure pattern, 2+4j erasure patterns to the codeword.

12. The Reed-Solomon code soft-decision decoding method of claim 11, wherein performing the decoding based on the syndrome and the second erasure pattern comprises:
applying, as the second erasure pattern, 4k erasure patterns to the codeword.

13. The Reed-Solomon code soft-decision decoding method of claim 12, wherein the 2+4j erasure patterns or the 4k erasure patterns are applied to the codeword in an order in which a symbol with low reliability among symbols in the codeword is preferentially erased.

14. A semiconductor device, comprising:
a memory cell array configured to store a codeword; and
a Reed-Solomon code soft-decision decoding device configured to read the codeword from the memory cell array, decode the codeword, and output error-corrected data corresponding to the codeword,
wherein the Reed-Solomon code soft-decision decoding device comprises:
a syndrome generation circuit configured to generate a syndrome from the codeword;
a key equation solver circuit configured to generate an error location polynomial and an error evaluation polynomial based on the syndrome;
a Chien-search & error-evaluator circuit configured to determine a location and magnitude of an error in the codeword based on the error location polynomial and the error evaluation polynomial;
a decoding error detection circuit configured to determine whether decoding on the codeword is successful or failed based on the location and magnitude of the error; and
an erasure control circuit configured to determine whether a number of errors in the codeword is odd or even, and to provide the key equation solver circuit with a first erasure pattern or a second erasure pattern according to a result of the determining when a decoding failure is detected by the decoding error detection circuit, the first erasure pattern being provided when the number of errors is odd, the second erasure pattern being provided when the number of errors is even.

15. The semiconductor device of claim 14, wherein the erasure control circuit receives the syndrome from the syndrome generation circuit and determines whether the number of errors in the codeword is odd or even by using characteristics of the syndrome.

16. The semiconductor device of claim 15, wherein, when a number of bits each having a value of 1 in the syndrome is odd, the erasure control circuit determines the number of errors to be odd, and when the number of bits each having the value of 1 in the syndrome is even, the erasure control circuit determines the number of errors to be even.

17. The semiconductor device of claim 14, wherein, when the number of errors is determined to be odd and the decoding failure is detected, the erasure control circuit provides, as the first erasure pattern, 2+4j erasure patterns to the key equation solver circuit.

18. The semiconductor device of claim 17, wherein, when the number of errors is determined to be even and the decoding failure is detected, the erasure control circuit provides, as the second erasure pattern, 4k erasure patterns to the key equation solver circuit.

19. The semiconductor device of claim 18, wherein the erasure control circuit provides the key equation solver circuit with the 2+4j (erasure patterns or the 4k erasure patterns in an order in which a symbol with low reliability among symbols in the codeword is preferentially erased.

* * * * *